(12) United States Patent
Deng et al.

(10) Patent No.: US 9,979,405 B1
(45) Date of Patent: May 22, 2018

(54) ADAPTIVELY RECONFIGURABLE TIME-TO-DIGITAL CONVERTER FOR DIGITAL PHASE-LOCKED LOOPS

(71) Applicant: Apple Inc., Cupertino, CA (US)

(72) Inventors: Wei Deng, San Jose, CA (US); Dennis M. Fischette, Jr., Mountain View, CA (US); Meei-Ling Chiang, Cupertino, CA (US); Samed Maltabas, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/429,481

(22) Filed: Feb. 10, 2017

(51) Int. Cl.
    H03L 7/06 (2006.01)
    H03L 7/095 (2006.01)
    H03L 7/091 (2006.01)
    H03L 7/099 (2006.01)

(52) U.S. Cl.
    CPC .............. *H03L 7/095* (2013.01); *H03L 7/091* (2013.01); *H03L 7/099* (2013.01)

(58) Field of Classification Search
    USPC .................................. 327/147–149, 156–158
    See application file for complete search history.

(56) References Cited

U.S. PATENT DOCUMENTS

| 6,377,093 | B1 | 4/2002 | Lee | |
| 7,522,005 | B1* | 4/2009 | Groe | H03C 3/08 331/1 A |
| 7,570,182 | B2 | 8/2009 | Sheba | |
| 7,679,468 | B1* | 3/2010 | Groe | H03C 3/0925 331/23 |
| 8,090,068 | B2 | 1/2012 | Sun | |
| 8,433,025 | B2 | 4/2013 | Sun | |
| 9,705,514 | B2* | 7/2017 | Perrott | H03L 7/0991 |
| 9,768,947 | B2* | 9/2017 | Hossain | H04L 7/0016 |
| 2008/0225174 | A1* | 9/2008 | Greggain | H04N 5/46 348/572 |
| 2015/0078495 | A1* | 3/2015 | Hossain | H04L 7/033 375/346 |
| 2015/0145566 | A1* | 5/2015 | Perrott | H03L 7/0991 327/154 |
| 2016/0049946 | A1* | 2/2016 | Liao | G04F 10/005 327/149 |
| 2016/0156363 | A1* | 6/2016 | Tsai | H03L 7/085 327/142 |

(Continued)

FOREIGN PATENT DOCUMENTS

WO          16095679          6/2016

*Primary Examiner* — Adam Houston
(74) *Attorney, Agent, or Firm* — Meyertons, Hood, Kivlin, Kowert & Goetzel, P.C.

(57) ABSTRACT

A digital PLL is disclosed. In one embodiment, the digital PLL includes a TDC coupled to receive a reference clock signal and feedback signal. The TDC includes a chain of serially-coupled delay elements. An oscillator in the PLL is configured to generate a periodic output signal. A divider is coupled to receive the periodic output signal and generate the feedback signal provided to the TDC. The digital PLL also includes a control circuit. During a phase-locking procedure, each of the serially-coupled delay elements is enabled for fast phase capture. However, once phase-lock has been detected by observing TDC output code, the control circuit is adaptively configured to disable all but a subset of the delay elements for saving power.

20 Claims, 9 Drawing Sheets

(56) References Cited

U.S. PATENT DOCUMENTS

2016/0182067 A1* 6/2016 Liu ................... H03L 7/091
327/158
2017/0134153 A1* 5/2017 Hossain ............ H04L 7/0016

* cited by examiner

US 9,979,405 B1

ADAPTIVELY RECONFIGURABLE TIME-TO-DIGITAL CONVERTER FOR DIGITAL PHASE-LOCKED LOOPS

BACKGROUND

Technical Field

This disclosure is directed to clock generation circuits, and more particularly, to digital phase-locked loops (PLLs).

Description of the Related Art

Phase-locked loops (PLLs) are widely used in electronic systems and integrated circuits (ICs), e.g., to generate clock signals and other types of periodic signals. PLLs can be implemented as analog or digital circuits.

An analog PLL includes a phase detector, an analog low pass filter, a voltage controlled oscillator (VCO), and a frequency divider. The frequency divider may be coupled in a feedback path between an output of the VCO and an input of the phase detector. The phase detector may receive a feedback signal from the frequency divider, and a reference clock signal from an external source. The phase detector detects a phase difference between the reference clock signal and the feedback signal, producing a voltage that is provided to the low pass filter. The low pass filter ensures the voltage remains stable, preventing the PLL from "hunting" and thus failing to achieve a lock. The VCO generates the output clock signal having a frequency that is a function of the voltage received from the low pass filter.

A digital PLL is similarly arranged, but replaces the phase detector with a time-to-digital converter (TDC). The TDC is configured to generate a digital value based on delays at various points between the reference clock signal and the feedback signal. The digital value may be provided to a thermometer-to-binary encoder, which can provide a digital code that is a digital equivalent of the phase error (i.e. phase detector output) in the analog PLL. A digital PLL may also include a digital low pass filter, and may in some embodiments utilize a numerically controlled oscillator (NCO) in place of a VCO.

SUMMARY

A digital PLL is disclosed. In one embodiment, the digital PLL includes a TDC coupled to receive a reference clock signal and feedback signal. The TDC includes a chain of serially-coupled delay elements. An oscillator in the PLL is configured to generate a periodic output signal. A divider is coupled to receive the periodic output signal and generate the feedback signal provided to the TDC. The digital PLL also includes a control circuit. During a phase-locking procedure, each of the serially-coupled delay elements is enabled. However, once phase-lock is detected by observing TDC output code, the control circuit is adaptively configured to disable all but a subset of the delay elements.

In one embodiment, the TDC also includes a number of comparators, each of which is coupled to receive a signal form a corresponding unique one of the delay elements. The comparators may compare levels of the reference clock signal to the feedback clock signal, and provide an indication of the comparison result to a thermometer-to-binary decoder. After phase lock is achieved, all but a subset of the comparators may be disabled. Disabling of the comparators and delay elements in one embodiment includes powering down these elements.

In some embodiments, a second chain of serially-coupled delay elements may be implemented, with their respective outputs coupled to corresponding inputs of one of the comparator circuits. As with the comparators and the first chain of serially-coupled delay elements, the elements of the second chain may be fully enabled during the phase locking procedure and disable, except for a subset, once phase lock has been achieved.

BRIEF DESCRIPTION OF THE DRAWINGS

The following detailed description makes reference to the accompanying drawings, which are now briefly described.

Figure 1:
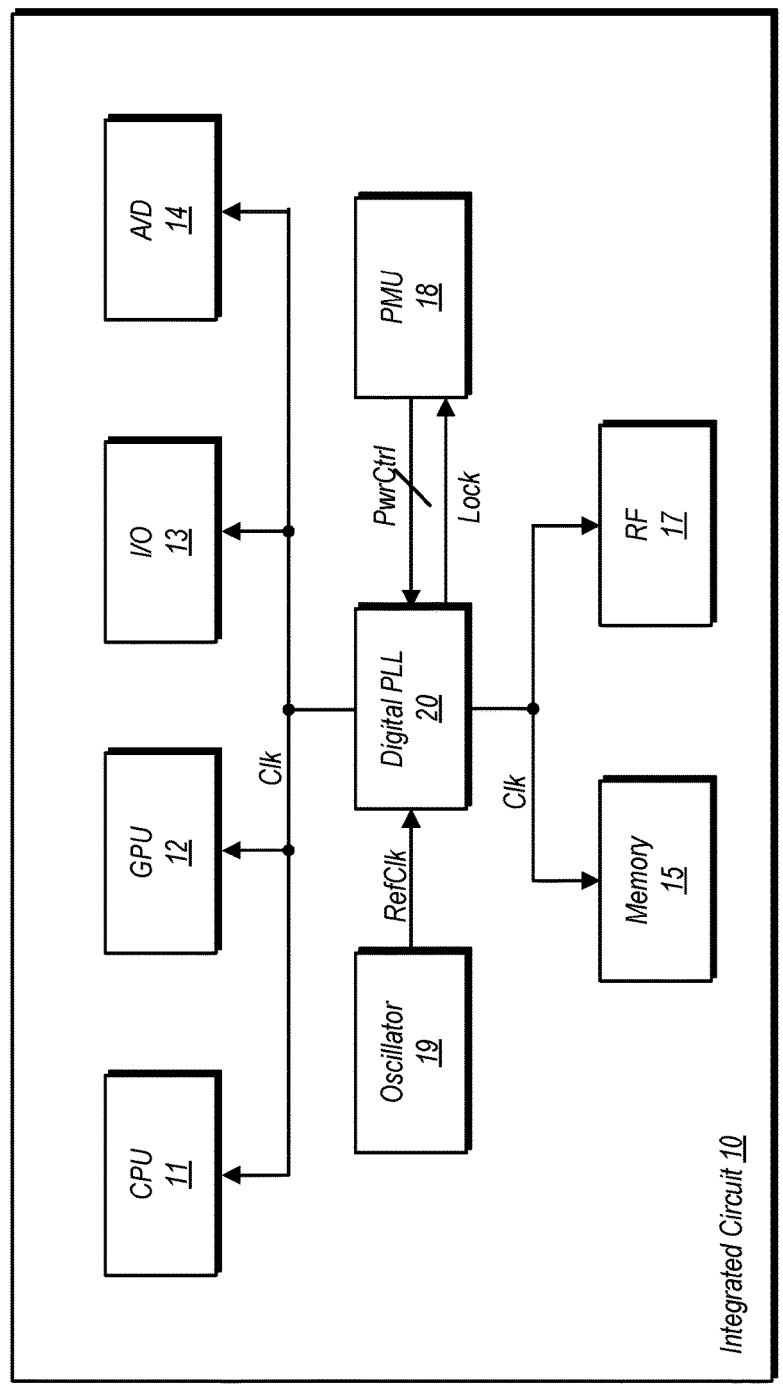
FIG. 1 is a block diagram of one embodiment of an integrated circuit (IC).

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of an exemplary embodiment of an integrated circuit (IC) is shown. In the illustrated embodiment, IC 10 includes a central processing unit (CPU) 11, a graphics processing unit (GPU) 12, an input/output (I/O) unit 13, analog-digital (A/D) conversion circuitry, a memory 15, and a radio frequency (RF) unit 17. Each of these functional circuit blocks is coupled to receive various clock signals (Clk) that are output from one or multiple digital phase-locked loops (PLLs) 20 (only one is shown here for the sake of simplicity). Digital PLL 20 is coupled to receive a reference clock signal (RefClk) from an oscillator 19. Additionally, digital PLL 20 is coupled to a power management unit (PMU) 18. PMU 18 may provide power control of digital PLL 20 responsive to whether it is in lock or not. Although other connections are not shown, PMU 18 may provide power and performance control for other functional circuit blocks of IC 10.

The clock signal generated by digital PLL 20 may be utilized to synchronize operation of circuits in each of the various functional circuit blocks by which it is received. Each of the functional circuit blocks may include additional circuits that may control the frequency of the clock signal as applied to the circuits therein (e.g., clock dividers within a given functional circuit block). Furthermore, in some embodiments, multiple instances of digital PLL 20 may be implemented.

Figure 2:
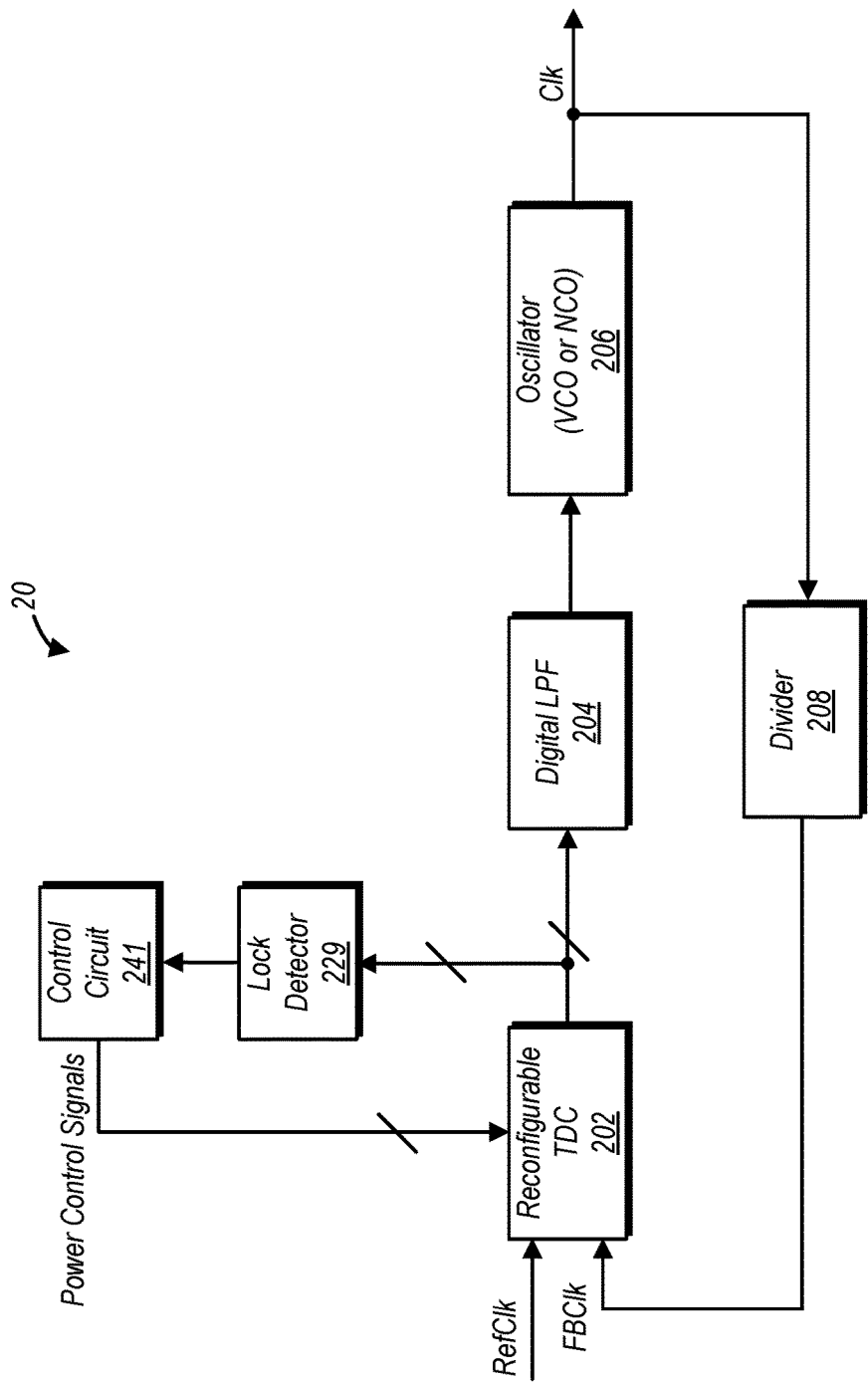
FIG. 2 is a simplified block diagram of one embodiment of a digital phase-locked loop (PLL).

FIG. 2 is a block diagram illustrating one embodiment of a digital PLL 20. In the embodiment shown, digital PLL 20 includes a time-to-digital converter (TDC) which replaces the phase detector of an analog PLL. As will be discussed below, TDC 202 may compare the levels of the reference clock signal to the feedback clock signal to determine a point at which the levels match, and thus a phase relationship between the two.

The output from TDC 202 may be a digital code having a number of bits generated by encoding circuitry thereon, and is provided to digital low pass filter (LPF) 204. Digital LPF 204 plays the normal role of an analog LPF in an analog PLL circuit, i.e. to stabilize and provide a clean output to the oscillator. Oscillator 206 may be either a voltage controlled oscillator (VCO) or a numerically controlled oscillator (NCO), depending on the output that digital LPF is designed to provide. In the case where digital LPF 204 provides a digital output, oscillator 206 may be implemented as an NCO. If digital LPF includes a digital-to-analog converter (DAC) so as to provide an analog output signal, oscillator 206 may be implemented as a VCO.

TDC 202 in the embodiment shown is also coupled to receive power control signals from power control circuitry. The power control circuitry may be implemented in, e.g., PMU 18, or may be implemented in other circuitry present in digital PLL 20 (e.g., in TDC 202). The signals provided by the power control circuitry may enable power control functions to be performed on digital PLL 20, and in particular, on TDC 202, as is discussed in further detail below.

The clock signal output, Clk, from oscillator 206 is the output clock signal that is provided to other functional circuits within the IC in which it is implemented. Additionally, Clk is provided to divider 208 to generate the feedback clock signal. Divider 208 may divide the Clk in terms of frequency to generate the feedback clock signal provided to TDC 202.

Digital PLL 20 in the embodiment shown also includes a lock detector 229 and a control circuit 241. Lock detector 229 in the embodiment shown includes circuitry coupled to receive the digital code output from TDC 202 to determine when lock has been achieved. Upon determining that lock has been achieved, lock detector 229 may provide an indication of the same to control circuit 241. Responsive to receiving an indication of the lock, control circuit 241 may assert various control signals to disable (e.g., power down) portions of TDC 202, as is discussed further below.

Figure 3:
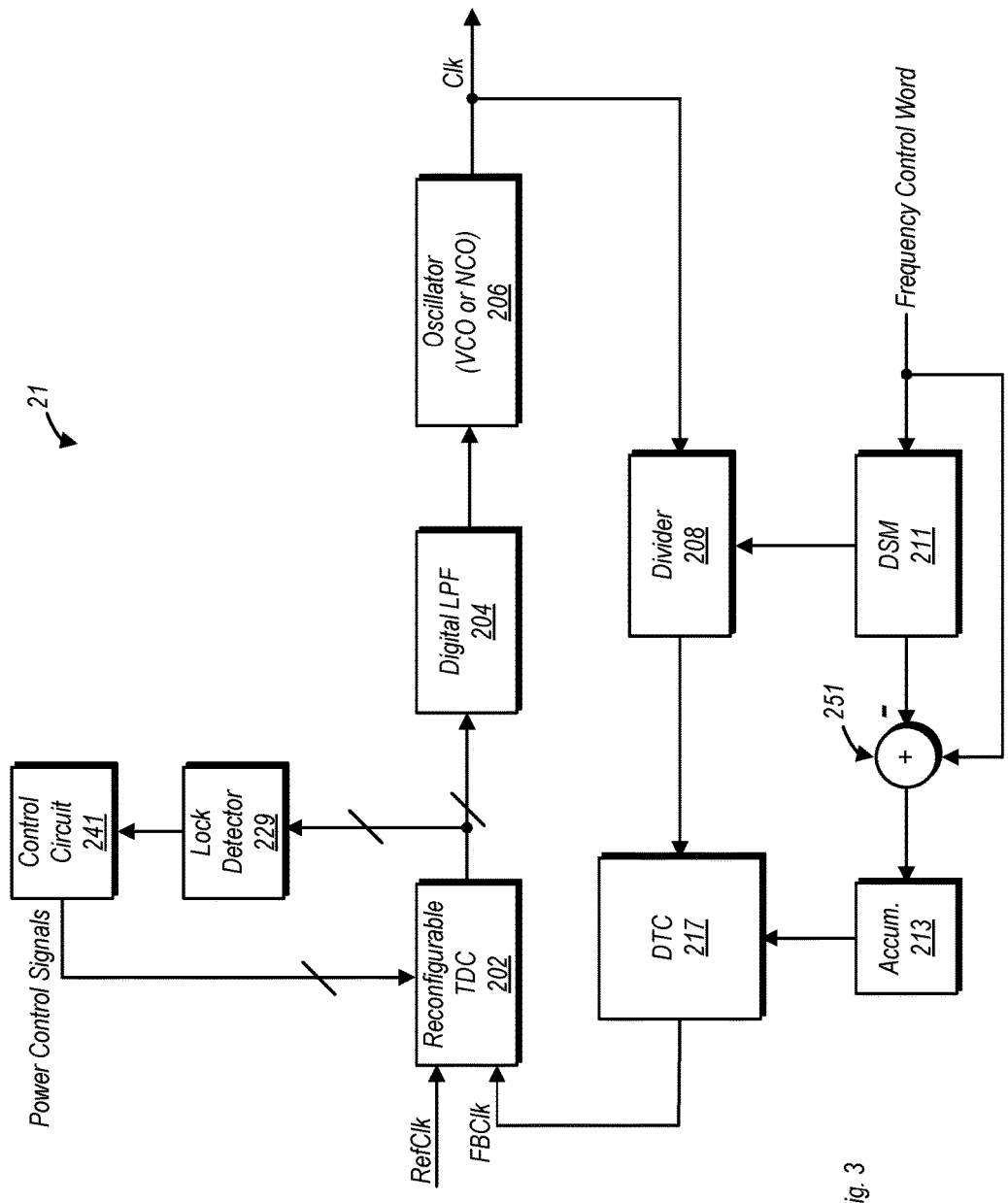
FIG. 3 is a simplified block diagram of another embodiment of a digital PLL.

FIG. 3 is a block diagram of another embodiment of a digital PLL. In this particular embodiment, digital PLL 21 is fractional-N PLL. In a fractional-N PLL, the divisor ratio may be changed such that the divisor is not an integer and thus enable digital PLL 21 to provide output frequencies that are not integer multiples of the reference frequency.

The divisor ratio in the embodiment shown may be controlled by delta-sigma modulator (DSM) 211, based on a received frequency control word. DSM 211 may switch the divider ratio accordingly. For example, if the divide ratio is to be 10.5, then DSM 211 may cause the divider ratio to be switched by values of 10 and 11 in alternating fashion. The output of divider 208 is provided to digital-to-time converter (DTC) 217, which may provide a phase-adjusted feedback clock signal. Due to the switching between values, quantization error may be present. The error may be determined by comparator 251 by comparing the output from DSM 211 to the frequency control word. Accumulator 213 may accumulate the errors over time. The output from accumulator 213 may be received by DTC 217, which may adjust the phase of the feedback clock signal based on the accumulated errors to enable TDC 202 to observe no phase errors and thus achieve fractional-N operation. In this embodiment, as in the previous embodiment, TDC 202 may be controllable to disable certain portions thereof once phase lock has been achieved.

Figure 4:
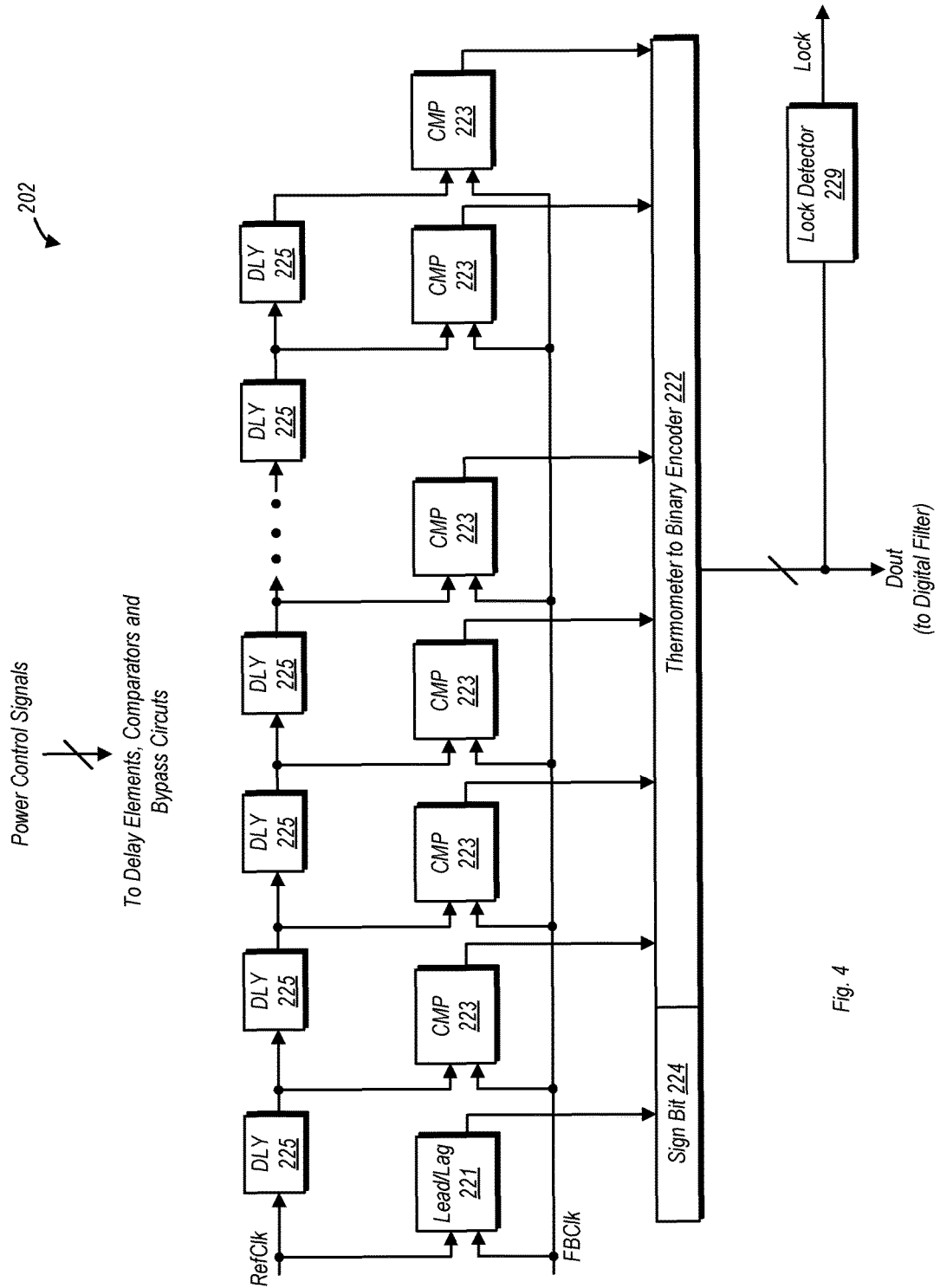
FIG. 4 is a simplified block diagram of one embodiment of a time-to-digital converter (TDC) used in a digital PLL.

FIG. 4 is a block diagram of one embodiment of TDC 202 that may be implemented in a digital PLL 20 in accordance with this disclosure. In the embodiment shown, TDC 202 includes a number of serially-coupled delay elements 225, a lead/lag circuit 224, a number of comparators 223, a sign bit register 224, a thermometer to binary encoder (TBE) 222, and a lock detector 229. In some embodiments, another set of serially-coupled delay elements may be implemented to receive the feedback clock signal.

In the embodiment shown, the reference clock signal and the feedback clock signal are both received without added delay by the lead/lag circuit 221. Lead/lag circuit 221 may determine which of the two clock signals is leading (or lagging) the other, and may output a sign bit to sign bit register 224. For example, if the lead/lag circuit indicates that the reference clock signal is leading the feedback clock signal, it may output a logic 1 to sign bit register 224 to indicate the same. Sign bit register may be implemented in any suitable manner, such as with a flip-flop or other appropriate circuitry.

The output of each delay element 225 in the embodiment shown is coupled as one input to a comparator 223. Since delay elements 225 are coupled in series, the output to any given delay element 225 is a cumulatively delayed version of the reference clock signal. The other input to each comparator 223 is the feedback clock signal. Each comparator may compare the levels (i.e. logic levels) of the feedback clock signal and the version of the delayed reference clock signal received from its correspondingly coupled one of the delay elements.

During normal operation, the comparison results output from comparators 223 may indicate whether there is a difference between the logic levels of the feedback clock signal and the reference clock signal. For example, in an individual one of the comparators 223, when the two inputs thereto match in level (i.e. the delayed reference clock and the feedback clock), a logic 1 may be output therefrom. If the logic levels are different in this example, a logic 0 is output from the respective comparator 223.

In such an embodiment, a number of consecutive comparators may output one logic value, while the other comparators (also consecutive) may output the other logic value. For example, if the reference clock is leading the feedback clock, a first number of consecutive comparators 223, beginning with the first one (from the left in the drawing) will output a logic 1, while a second number of consecutive comparators 223 will output a logic 0. Thus, if there are ten comparators overall, a comparison results from all comparators as applied to this particular example could look something like the following: 1111100000. This would indicate that the logic levels of the reference clock and the feedback clock matched in the first five comparators 223, and were of opposite values in the next five comparators 223. The "1-to-0" or "0-to-1" transitions indicates phase alignments between delayed reference clock and feedback clock.

Various types of circuitry may be used to implement comparators 223. In one embodiment, comparators 223 may be implemented using D-type flip-flops. In such an embodiment, the output from a correspondingly coupled delay element 225 may be coupled to the D-input. The feedback clock could be coupled to the clock input of each D-type flip-flop. When the feedback clock transitions from low-to-high, each flip-flop receiving a logic 1 on its D-input would output a logic 1, while each flip-flop receiving a logic 0 on its D-input would output a logic 0. However, this is one example, and other types of circuitry may be used to implement comparators 223. Such circuits may include various logic gates (e.g., AND gates) and/or any other circuitry suitable to achieve the desired comparison operation.

The output of the comparators 223, which indicate respective comparison results, are then provided to TBE 222. TBE 222 may generate a digital code (Dout) based on the comparison results received from comparators 223, along with the sign bit stored in sign bit register 224. The digital code may indicate whether phase lock has occurred, and may also indicate the point within TDC 202 where lock is detected. The point at which lock is detected within TDC 202 may be indicated by the thermometer code.

The digital code Dout may be provided to the digital LPF 204 of digital PLL 20, which may perform a low pass filtering function in the digital domain, as described above. Additionally, Dout may also be provided to lock detector 229, which may assert the lock signal responsive to lock being achieved. The lock signal may be de-asserted if lock is lost during operation. In one embodiment, the lock signal may be provided to power control circuitry (such as PMU 18), which may perform power control functions on TDC 202. The digital code Dout may also be provided to the power control circuitry. In some cases, the power control circuitry may be implemented in lock detector 229 itself.

In the embodiment shown, TDC 202 is coupled to receive power control signals. In some embodiments, power control circuitry dedicated to digital PLL 20 may be provided (e.g., such as lock detector 229 and control circuit 241 as shown in FIGS. 2 and 3). In other embodiments, a lock detector 229 may provide an indication of lock having been achieved (and the full output word, Dout, from TBE 222) to a power management circuit (e.g., PMU 18 of FIG. 1). In either case, the power control signals may operate to perform power control functions on TDC 202 once lock has been achieved. For example, certain delay elements and comparators may be disabled (e.g., powered down) after lock has been achieved.

Figure 5:
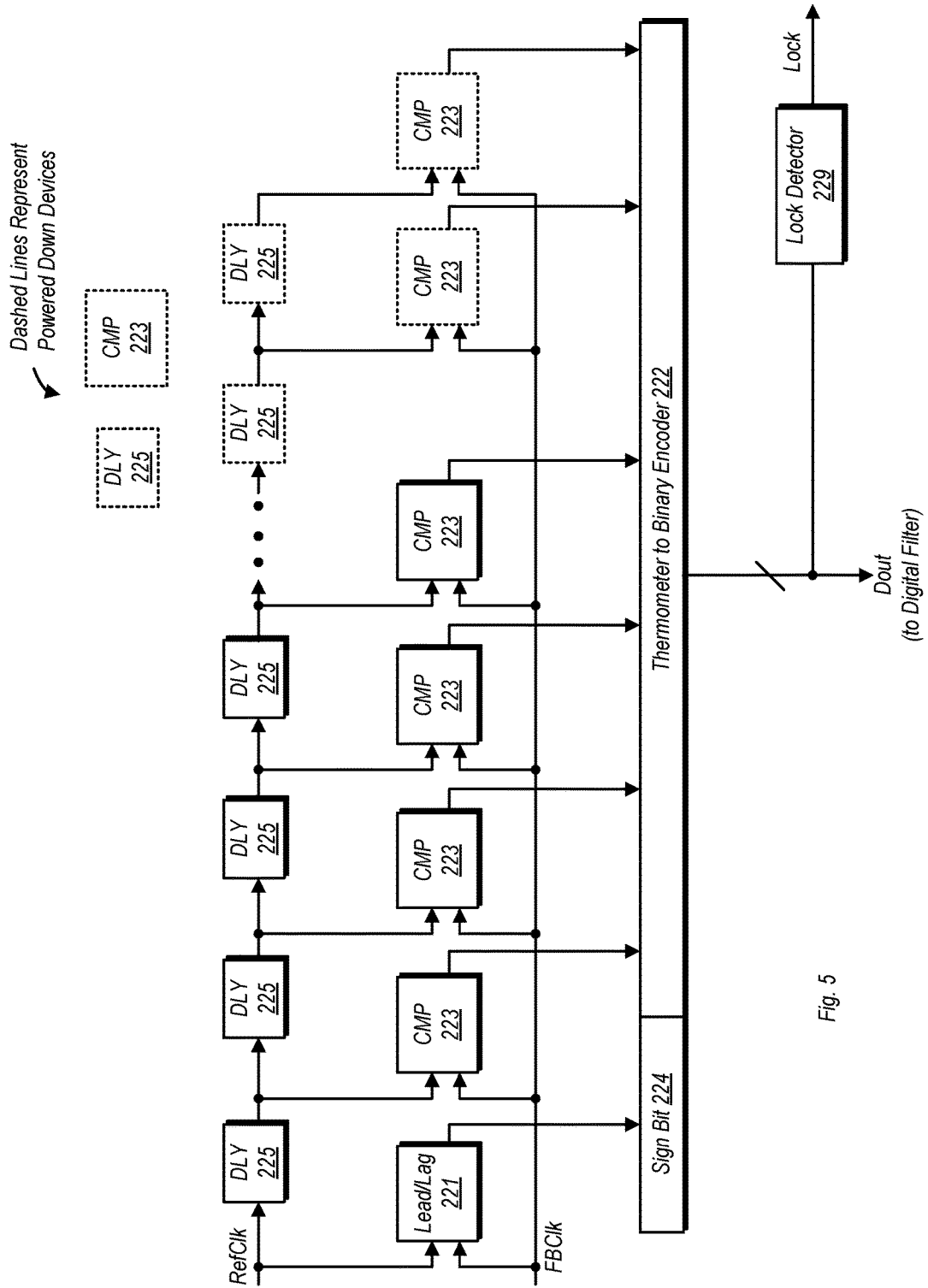
FIG. 5 illustrates an example of TDC operation after phase lock has been achieved in one embodiment of a digital PLL.

FIG. 5 is an exemplary illustration of one embodiment of TDC 202 with only select delay elements and comparators enabled when digital PLL 20 is in the locked state. In the illustrated example, lock has been achieved and those delay elements 225 and comparators 223 denoted by dashed lines are powered down. Thus, only those delay elements 225 and comparators 223 used to maintain the locked condition for digital PLL 20 remain powered on.

In this particular example, the delay elements 225 toward the left of the drawing are enable such that the reference clock signal may be conveyed through the delay elements up to the approximate point where lock is detected (e.g., where the respective comparator outputs change from logic 1's to logic 0's). After this point, the delay elements 225 do not contribute to maintaining the locked state, and may thus be powered down. Additionally, correspondingly coupled comparators 223 may also be powered down. Thus, all delay elements 225 and comparators 223 that are subsequent to the lock point may be powered down after lock is achieved, and may remain powered down as long as lock is maintained.

The ability to power down selected delay elements after lock has been achieved may provide power savings in digital PLL 20. Digital PLLs typically use a wide range in the TDC during phase capture, and thus a large number of delay elements may be implemented. Correspondingly, a large number of comparators may also be implemented. The power consumption of these delay elements and comparators may be significant. Thus, the ability to power down a significant number of delay elements and comparators after lock has been achieved may cut power consumption by a significant amount. Generally speaking, TDC 202 may in various embodiments be implemented such that a majority of the delay cells and comparators are powered down after digital PLL 20 is in the locked state.

It is noted that TBE 222 in various embodiments may be designed to hold the most recent state of bits received from each of the comparators 223. Accordingly, TBE 222 may maintain the most recent state of the bits received from those comparators 223 that are powered down after lock is achieved. In this manner, TBE 222 may continue to provide the same digital code on Dout after selected comparators 223 are powered down during the lock state. For those comparators 223 that remain powered on, TBE 222 may update the bits received therefrom.

Figure 6:
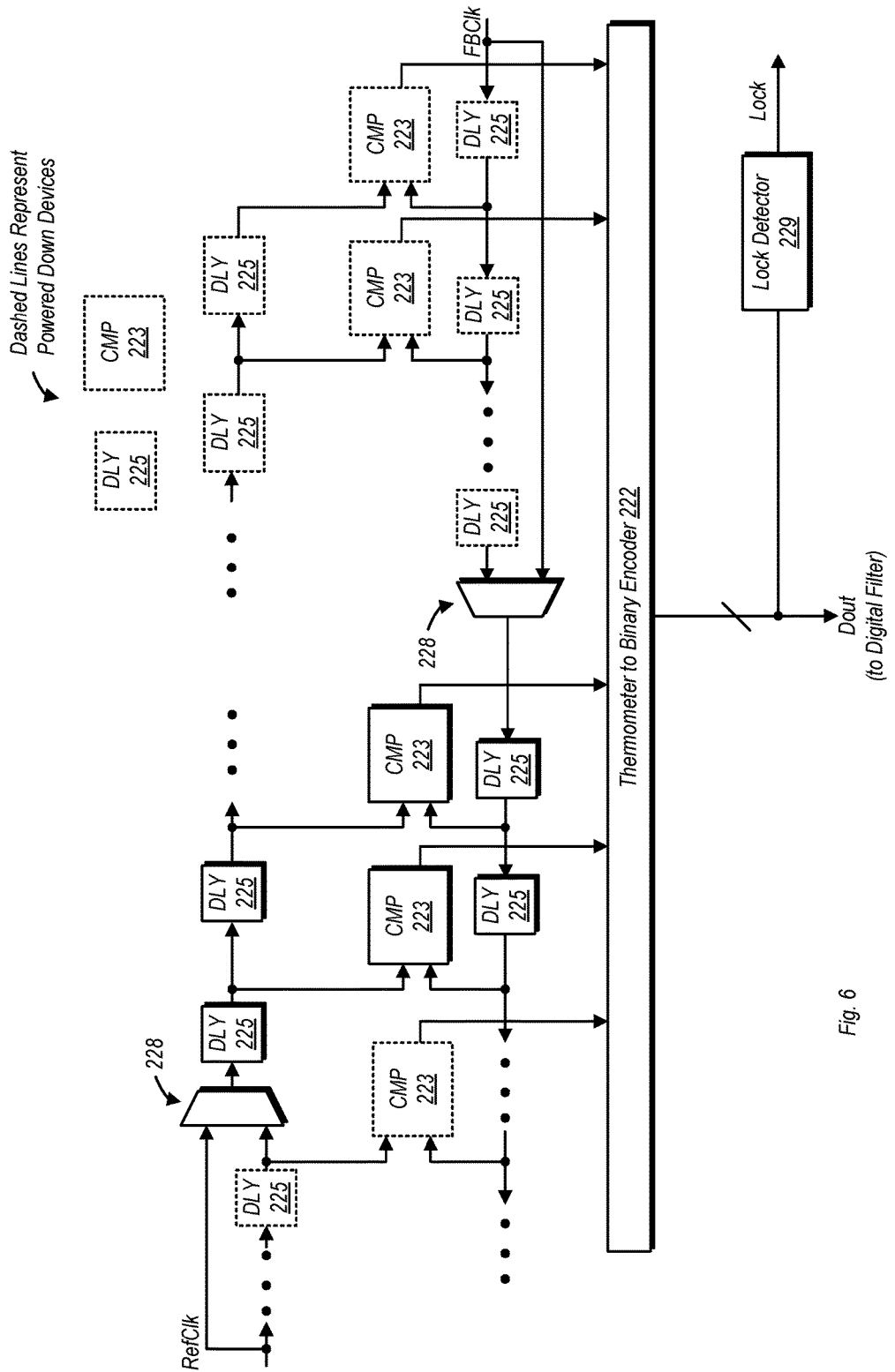
FIG. 6 illustrates an example of TDC operation after phase lock has been achieve in another embodiment of a digital PLL.

FIG. 6 illustrates another embodiment of a TDC in which even a greater number of delay elements and comparators are powered down during the locked state. In this particular example, two chains of serially-coupled delay elements 225 are present, one that applies delay to the reference clock signal and another that applied delay to the feedback clock signal. Bypass circuitry 228 (shown here as 2-1 multiplexers) may be used to bypass delay elements 225 in each chain that are unused in maintaining the locked condition, thereby enabling them to be powered down. Thus, as shown in this example, only a select few of the delay elements 225 in each chain, along with their associated comparators 223, remain powered on after lock has been achieved.

In this particular embodiment, the amount of delay applied by each delay elements 225 may be variable. Thus, the delay applied by particular delay elements that remain powered on may differ between the locking and locked states of a digital PLL in which this type of TDC is implemented. For example, the delay elements 225 of one embodiment may each apply a fine delay to the reference clock signal during the phase capture/locking phase, while at least some delay elements may apply a coarse delay during the locked phase. Generally speaking, the number of delay elements remaining active during the locked state, and the respective delays applied by each, may be adjusted to match the delay values at which lock was achieved.

It is noted that while a sign bit register 224, is not shown in this particular example, on may nevertheless be present. Similarly, a lead/lag circuit 221, also not shown here, may also be present.

Figure 7:
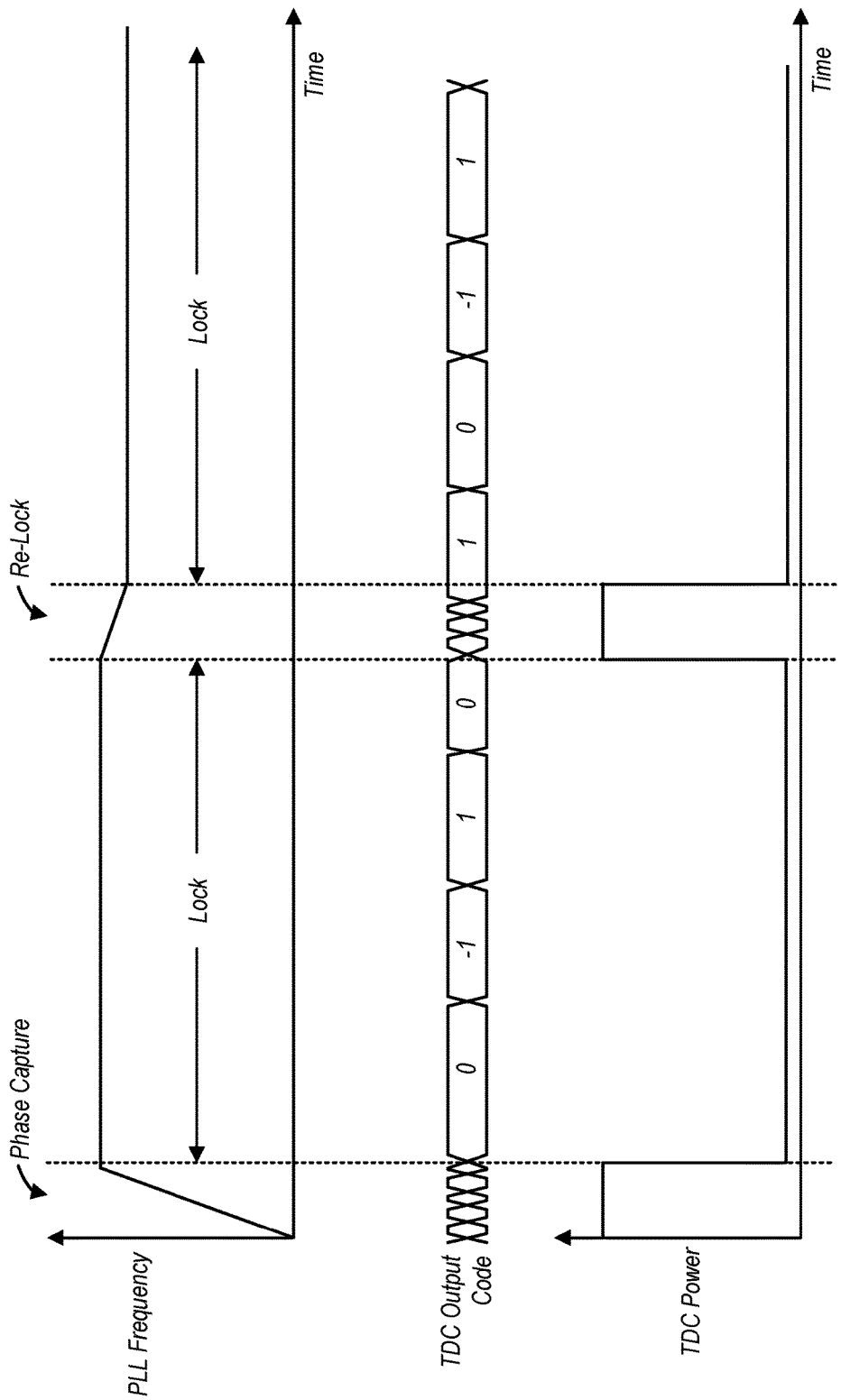
FIG. 7 is a diagram illustrating power consumption of one embodiment of a digital PLL during phase capture and lock.

FIG. 7 is an exemplary graphic illustration of the variation in power consumption by digital PLL 20 between the phase capture/re-lock states and locked states. During the initial phase capture state, PLL frequency, i.e. the frequency of the output clock signal, increases (upper graph), while TDC power consumption is relatively high (lower graph). After lock is achieved, the PLL frequency stabilized, and TDC power consumption decreases significantly due to the powering down of a number of delay elements 225 and comparators 223. This state remains until digital PLL 20 enters a re-lock phase (e.g., due to losing lock, a change to the reference clock signal frequency, etc.). Power consumption then increases as all delay elements 225 and comparators 223 are activated to perform the re-lock. Once re-lock is achieved, the frequency again stabilities, and TDC power consumption again decreases as various delay elements 225 and comparators 223 are powered down.

FIG. 7 also includes an illustration of the variation of TDC output word (Dout) from TBE 222 during the locked state. When not locked, the TDC output word varies considerably and frequently. However, when the digital PLL is in a locked state, the output word (or the portion associated with the delay elements/comparators around the lock point) dither between values of −1 and 1. A value of 0 indicates zero phase error, while values of −1 and 1 indicate very small phase errors.

Figure 8:
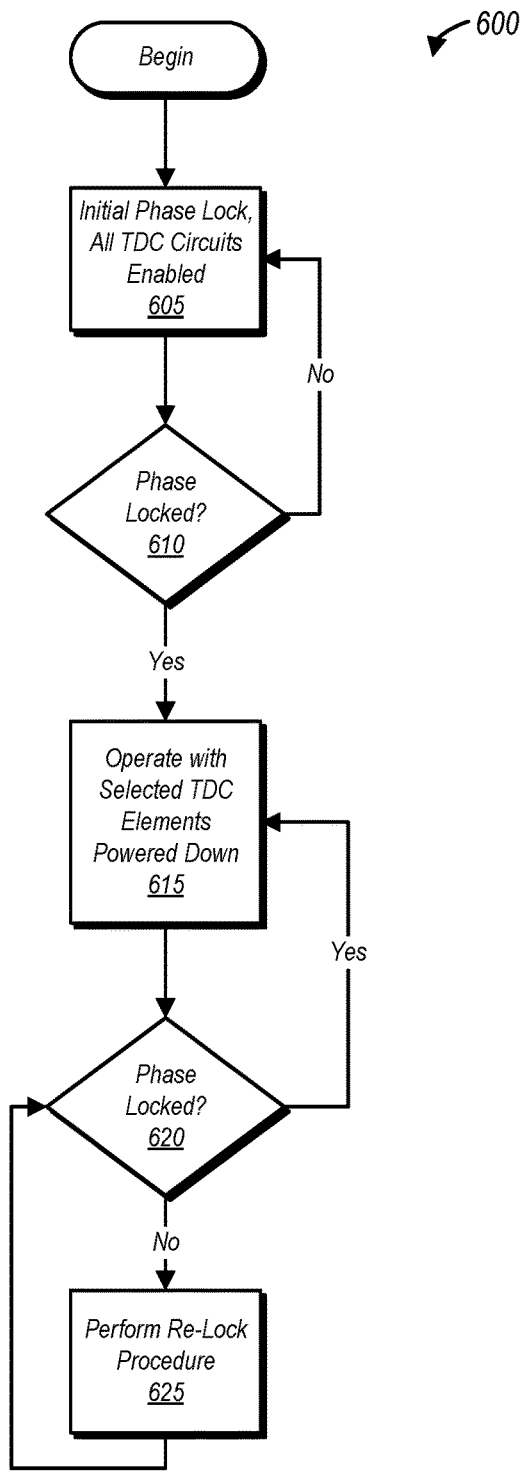
FIG. 8 a flow diagram illustrating operation of one embodiment of a digital PLL.

FIG. 8 is a flow diagram illustrating operation of one embodiment of a digital PLL. Method 600 as shown herein may be performed by various embodiments of digital PLL 20 as discussed above, including the various embodiments of individual units thereof (e.g., TDC 202). Furthermore, method 600 may be performed by other embodiments of a digital PLL in which various circuit elements of a TDC may be powered down once lock has been attained.

Method 600 begins with initial operation of a digital PLL, an initial phase lock (or capture), with all elements of a TDC enabled (block 605). This operation continues as long as lock has not yet been achieved (block 610, no).

Once phase lock is achieved (block 610, yes), the TDC is operated with selected elements powered down (block 615). Depending on the design of the TDC, a majority of circuit elements implemented therein may be powered down, while power remains provided to those elements used to maintain the locked state of the digital PLL. This operation continues as long as the digital PLL remains in the locked state (block 620, yes). If for some reason (e.g., change in frequency to the reference clock signal) the digital PLL is no longer in the locked state (block 620, no), then a re-lock procedure may be performed (block 625) with all circuit elements of the TDC powered on. The method may then return to block 620, and once lock is attained again, to block 615.

Figure 9:
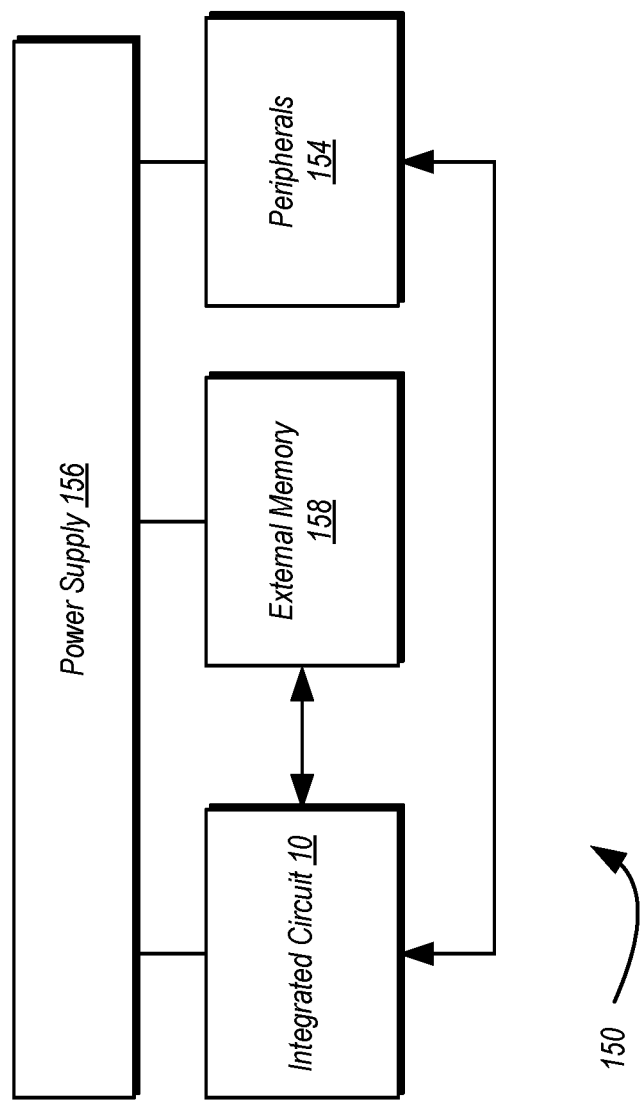
FIG. 9 is a block diagram of one embodiment of an exemplary system.

Turning next to FIG. 9, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A phase-locked loop (PLL) circuit comprising:
  a time-to-digital converter (TDC) circuit configured to receive a reference clock signal on a first input and a feedback signal on a second input, the TDC including at least a first plurality of serially-coupled delay elements;
  an oscillator configured to generate a periodic output signal;
  a divider circuit configured to generate the feedback signal based on a PLL output signal provided by the oscillator; and
  a control circuit configured to enable each of the first plurality of serially-coupled delay elements during a phase-locking procedure, and further configured to, responsive to the PLL achieving phase-lock, disable all but a subset of the first plurality of serially-coupled delay elements.

2. The PLL circuit as recited in claim 1, further comprising a plurality of comparator circuits each coupled to a corresponding ones of first plurality of serially-coupled delay elements, wherein each of the each of the comparator circuits is configured to compare a received value of the reference clock signal to a received value of the feedback signal.

3. The PLL circuit as recited in claim 2, further comprising a second plurality of serially-coupled delay elements coupled to receive the feedback clock signal, each of the second plurality of serially-coupled delay elements having an output coupled to a corresponding one of the plurality of comparator circuits, and wherein the control circuit is further configured to:

enable each of the second plurality of serially-coupled delay elements and each of the plurality of comparator circuits during the phase-locking procedure; and
disable all but a subset of the second plurality of serially-coupled delay elements disable all but a subset of the comparator circuits responsive to the PLL achieving phase-lock.

4. The PLL circuit as recited in claim 3, wherein the control circuit is configured to disable subsets of the first and second pluralities of serially-coupled delay elements and the plurality of comparator circuits by removing power from the first and second pluralities of serially-coupled delay elements and the plurality of comparator circuits.

5. The PLL circuit as recited in claim 3, wherein a first one of the first plurality of serially-coupled delay elements is coupled to receive the reference clock signal, and wherein a first one of the second plurality of serially-coupled delay elements is coupled to receive the feedback signal.

6. The PLL circuit as recited in claim 2, further comprising a thermometer-to-binary code circuit coupled to receive a respective output signal from each of the plurality of comparator circuits, wherein the thermometer-to-binary code circuit is configured to generate a binary code based on the respective output signals received from each of the plurality of comparator circuits.

7. The PLL circuit as recited in claim 6, further comprising a lead/lag circuit configured to determine if the reference clock is leading or lagging the feedback signal, and a sign bit circuit coupled to receive a lead/lag indication from the lead/lag circuit, wherein the sign bit circuit is configured to output a sign bit having a value depending on whether the binary code represents a positive or negative value.

8. The PLL circuit as recited in claim 1, further comprising a digital low low-pass filter coupled to receive an output signal from the TDC further coupled to provide an output signal to the oscillator.

9. The PLL circuit as recited in claim 8, wherein the oscillator is a digitally controlled oscillator, and wherein the output signal from the TDC is a digital code, wherein a frequency of the periodic output signal corresponds to the digital code.

10. The PLL circuit as recited in claim 8, wherein the digital low-pass filter is configured to generate a voltage signal, wherein the oscillator is a voltage-controlled oscillator, and wherein a frequency of the periodic output signal is dependent on the voltage signal.

11. A method comprising:
  a divider circuit generating a feedback signal by dividing a periodic output signal received from an oscillator;
  performing a locking procedure in a digital phase-locked loop (PLL) circuit, wherein performing the locking procedure comprises providing, to a time-to-digital converter (TDC) circuit, a reference clock signal on a first input and a feedback signal on a second input, the TDC including a plurality of serially-coupled delay elements, wherein performing the locking procedure includes a control circuit enabling each of the plurality of serially-coupled delay elements during; and
  responsive to achieving a phase-lock, a control circuit disabling all but a subset of the plurality of serially-coupled delay elements.

12. The method as recited in claim 11, further comprising:
  each of a plurality of comparators receiving, during the locking procedure, the reference clock signal and an output signal from a correspondingly coupled one of the plurality of serially-coupled delay elements;

each of the plurality of comparators comparing, a level of the feedback signal to a level of the output signal received from its correspondingly coupled one of the plurality of delay elements.

13. The method as recited in claim 12, wherein disabling all but the subset of the plurality of serially-coupled delay elements comprises powering down all but the subset of the plurality of serially-coupled delay elements, and wherein the method further comprises disabling all but a subset of the plurality of comparators coupled to particular ones of the subset of the plurality of serially-coupled delay elements.

14. The method as recited in claim 12, further comprising:
during the locking procedure, providing output signals from each of the plurality of comparators to a thermometer-to-binary code circuit; and
generating a binary code based on the respective output signals received from each of the plurality of comparators.

15. The method as recited in claim 11, further comprising:
providing an output from the TDC to a digital low-pass filter;
providing one or more output signals from the digital low-pass filter to the oscillator; and
generating the periodic output signal at a frequency dependent on the one or more output signals.

16. A phase-locked loop (PLL) comprising:
a time-to-digital converter (TDC) circuit configured to receive a reference clock signal on a first input and a feedback signal on a second input, wherein the TDC circuit includes a first plurality of serially-coupled delay elements, a second plurality of serially-coupled delay elements, and a plurality of comparator circuits each coupled to corresponding ones of first and second pluralities of serially-coupled delay elements;
a low-pass filter circuit coupled to receive an output from the TDC circuit;
a voltage controlled oscillator (VCO) coupled to receive an output from the low-pass filter circuit;
a divider circuit configured to generate the feedback signal based on a PLL output signal provided by the VCO; and
a control circuit, wherein the control circuit is configured to, prior to the TDC circuit indicating a phase lock, enable each delay element of the first and second pluralities of delay elements, and further configured to, responsive to the TDC circuit indicating a phase lock:
disable a subset of the delay elements of the first and second pluralities of delay elements; and
disable a subset of the plurality of comparator circuits.

17. The PLL as recited in claim 16, wherein the control circuit is configured to disable subsets of the first and second pluralities of serially-coupled delay elements and the plurality of comparator circuits by removing power from the first and second pluralities of serially-coupled delay elements and the plurality of comparator circuits.

18. The PLL as recited in claim 17, wherein a first one of the first plurality of serially-coupled delay elements is coupled to receive the reference clock signal, and wherein a first one of the second plurality of serially-coupled delay elements is coupled to receive the feedback signal.

19. The PLL as recited in claim 16, further comprising a thermometer-to-binary code circuit coupled to receive a respective output signal from each of the plurality of comparator circuits, wherein the thermometer-to-binary code circuit is configured to generate a binary code based on the respective output signals received from each of the plurality of comparator circuits.

20. The PLL as recited in claim 19, further comprising a lead/lag circuit configured to determine if the reference clock is leading or lagging the feedback signal, and a sign bit circuit coupled to receive a lead/lag indication from the lead/lag circuit, wherein the sign bit circuit is configured to output a sign bit having a value depending on whether the binary code represents a positive or negative value.

\* \* \* \* \*